US011919289B2

(12) United States Patent
Ackermann

(10) Patent No.: US 11,919,289 B2
(45) Date of Patent: Mar. 5, 2024

(54) APPARATUS FOR IRRADIATING A SUBSTRATE

(71) Applicant: Gunther Ackermann, Kolbermoor (DE)

(72) Inventor: Gunther Ackermann, Kolbermoor (DE)

( * ) Notice: Subject to any disclaimer, the term of this patent is extended or adjusted under 35 U.S.C. 154(b) by 0 days.

(21) Appl. No.: 17/923,859

(22) PCT Filed: Apr. 6, 2021

(86) PCT No.: PCT/DE2021/000062
§ 371 (c)(1),
(2) Date: Nov. 7, 2022

(87) PCT Pub. No.: WO2021/223787
PCT Pub. Date: Nov. 11, 2021

(65) Prior Publication Data
US 2023/0173803 A1    Jun. 8, 2023

(30) Foreign Application Priority Data
May 8, 2020  (DE) .................... 20 2020 002 017.6

(51) Int. Cl.
*B41F 23/04* (2006.01)
*H05B 3/00* (2006.01)
*H05K 7/20* (2006.01)

(52) U.S. Cl.
CPC ........ *B41F 23/0436* (2013.01); *B41F 23/044* (2013.01); *H05B 3/0038* (2013.01);
(Continued)

(58) Field of Classification Search
CPC .. B41F 23/0436; B41F 23/044; H05B 3/0038; H05K 7/2016; H05K 7/20154; H05K 7/2039
See application file for complete search history.

(56) References Cited

U.S. PATENT DOCUMENTS 3,874,091 A * 4/1975 Fukumoto ............. F26B 13/104
34/652
6,030,076 A * 2/2000 Yoshimura ............. B41J 3/4078
347/4
(Continued)

FOREIGN PATENT DOCUMENTS

DE    102010046756 A1    3/2012
DE    102017011881 A1    6/2019
DE    102017129017 A1    6/2019

OTHER PUBLICATIONS

International Search Report and Written Opinion, PCT/DE2021/000062, dated Jul. 28, 2021, 11 pages.

*Primary Examiner* — David H Banh

(57) ABSTRACT

The invention relates to an apparatus (1) for irradiating a substrate (2), which apparatus comprises a platform (4), which is straight or curved in relation to the longitudinal axis (3) of the platform (4), wherein one, two, three, four, five, six, seven, eight, nine, ten or more irradiation modules (6) and/or substrate supply air modules (36) and/or substrate exhaust air modules (37) are reversibly attachable directly or indirectly to the bottom side (8) of the platform (4) by sliding or inserting or mounting in one or more fixed or telescoping module attachment devices (10) provided on the bottom side (8) of the platform (4)—each extending from the front side (5) of the apparatus (1) and in the direction of the back side (9) of the apparatus (1).

12 Claims, 6 Drawing Sheets

(52) U.S. Cl.
 CPC ..... *H05K 7/20136* (2013.01); *H05K 7/20154* (2013.01); *H05K 7/2039* (2013.01)

(56) References Cited

U.S. PATENT DOCUMENTS

| | | | | |
|---|---|---|---|---|
| 6,698,879 | B1* | 3/2004 | Hindriks | B41J 15/16 |
| | | | | 347/105 |
| 2007/0062397 | A1* | 3/2007 | Gydesen | B41F 23/044 |
| | | | | 101/424.1 |
| 2007/0089623 | A1* | 4/2007 | Hamamoto | B41F 23/044 |
| | | | | 101/424.1 |
| 2017/0202106 | A1* | 7/2017 | Bhutta | H01J 37/3299 |
| 2020/0300542 | A1* | 9/2020 | Graziel | F26B 3/04 |

* cited by examiner

APPARATUS FOR IRRADIATING A SUBSTRATE

The present invention relates to a device for irradiating a substrate, having the features specified in claim 1.

DE 102 34 076 A1 discloses a flat printing machine for 4-color offset printing, in which radiation energy of the near infrared wavelength range is supplied to a printing material, wherein an infrared absorbent is added to the printing ink. The radiation is generated there from single emitters arranged in series next to each other and in succession.

This irradiation apparatus known from DE 102 34 076 A1 is disadvantageous in particular because, in the event of a fault of the defective emitters—which is not discernible from the back side—first it must be tediously investigated, time-intensively removed, repaired, reinstalled, and then adjusted in relation to its alignment—including possible failures.

The problem of the present invention is therefore to provide an apparatus for irradiating substrates, which—in the event of a fault of one or more irradiation devices—allows for a particularly simple, fast, effortless repair that excludes the possibility of failure.

According to the present invention, this problem is solved by a generic apparatus for the irradiation of substrates, having the features specified in claim 1. Particularly preferred embodiments of the apparatus according to the invention are the subject matter of the sub-claims.

Figure 1:
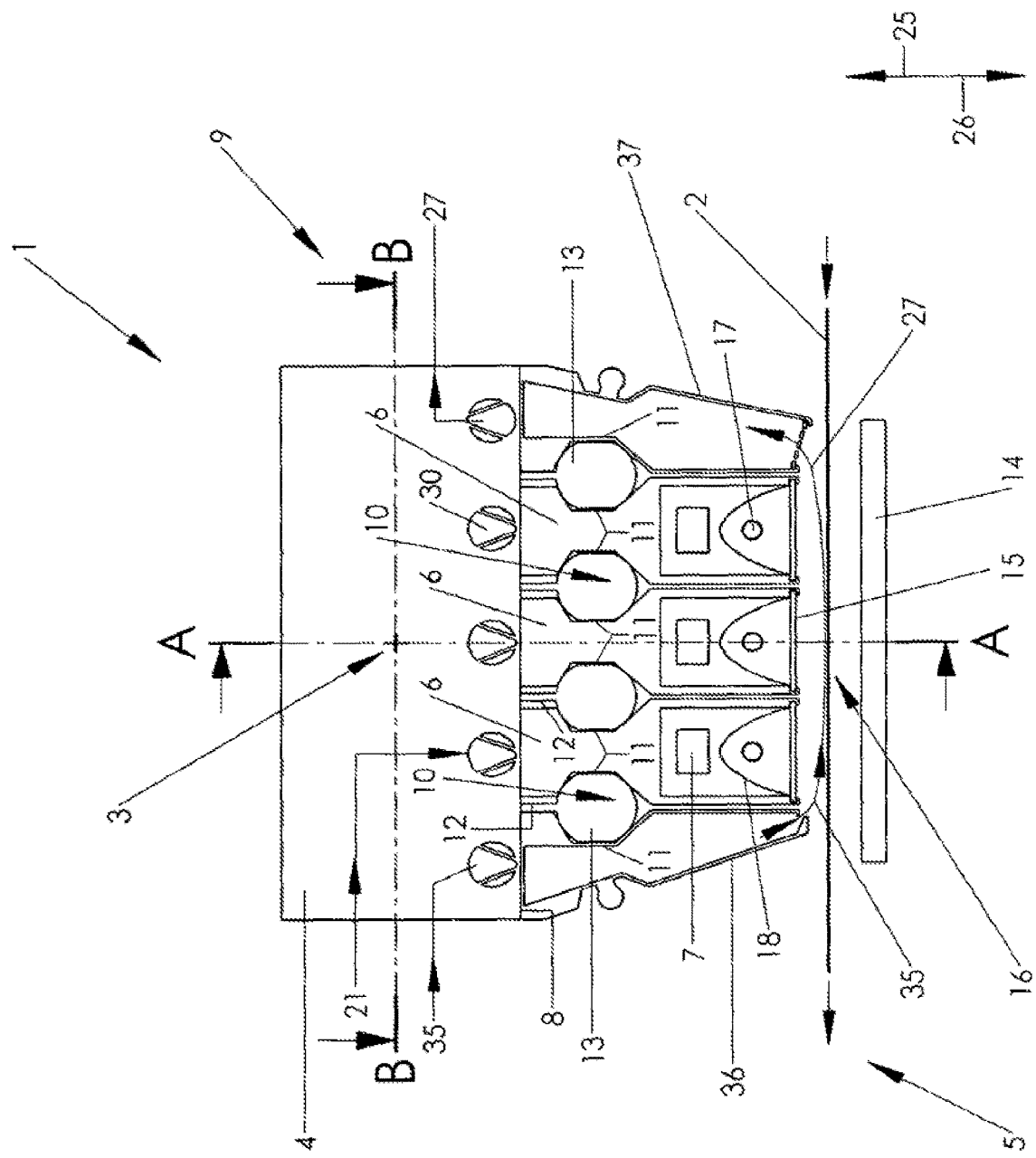
Figure 2:
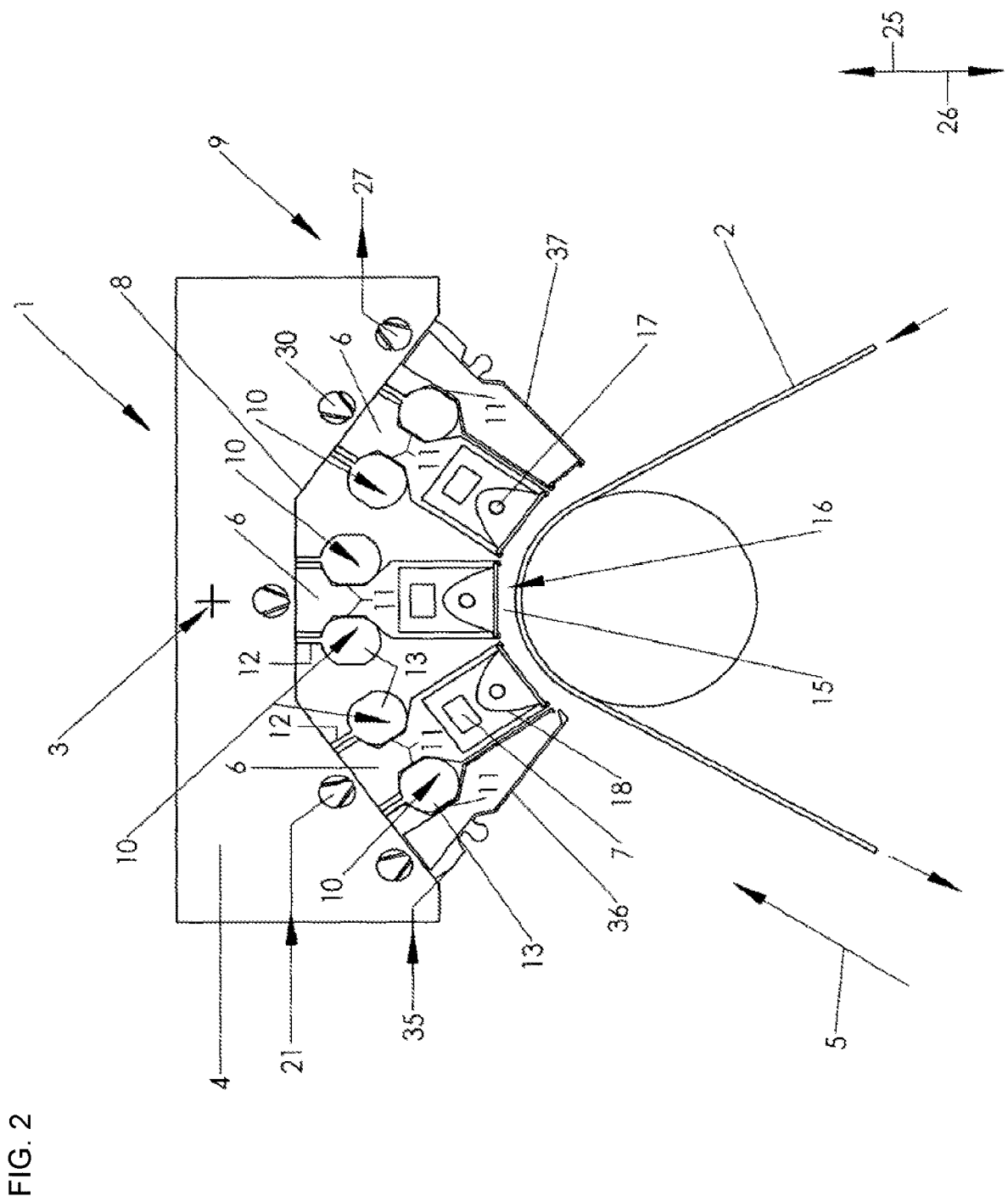
Figure 3:
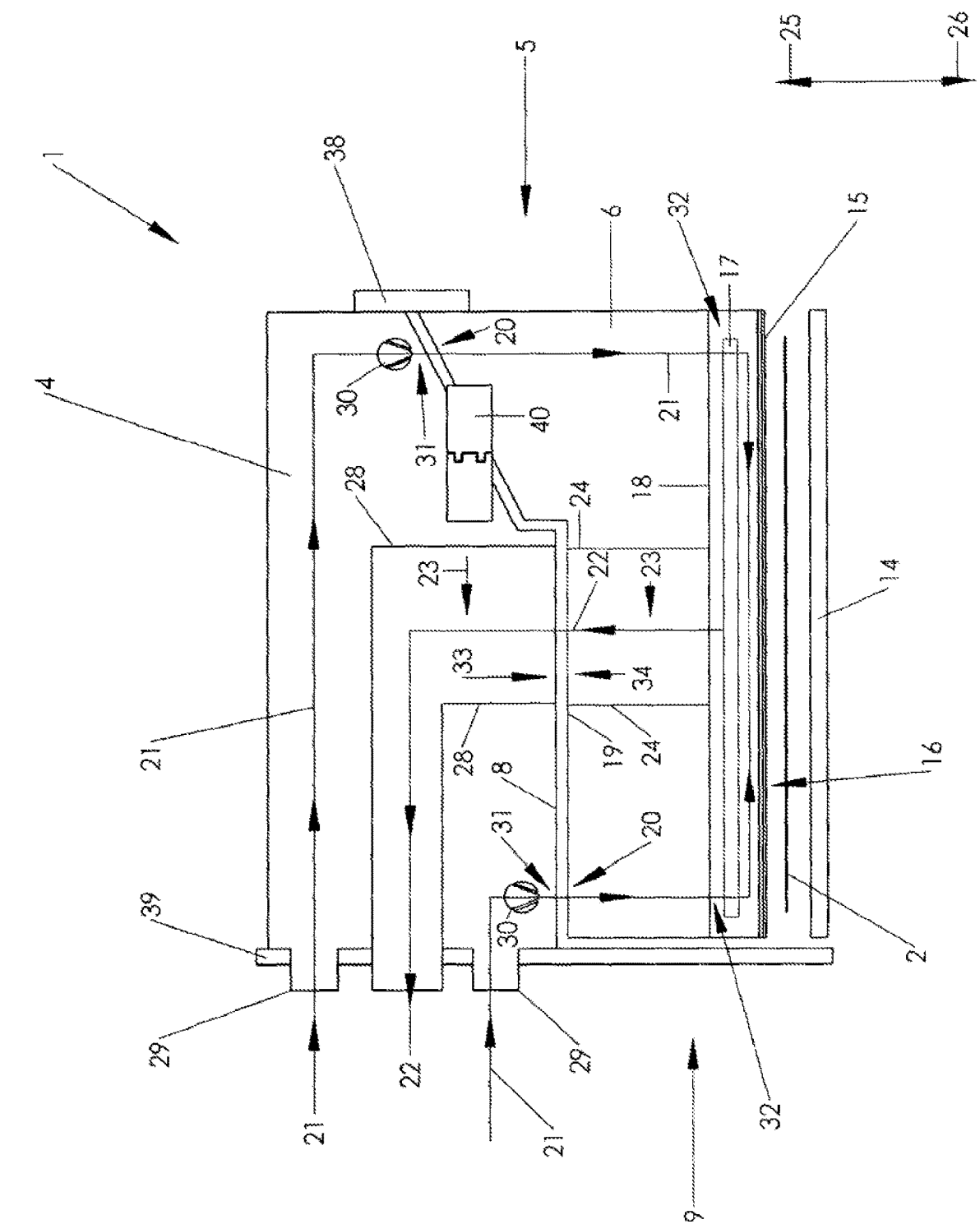
Figure 4:
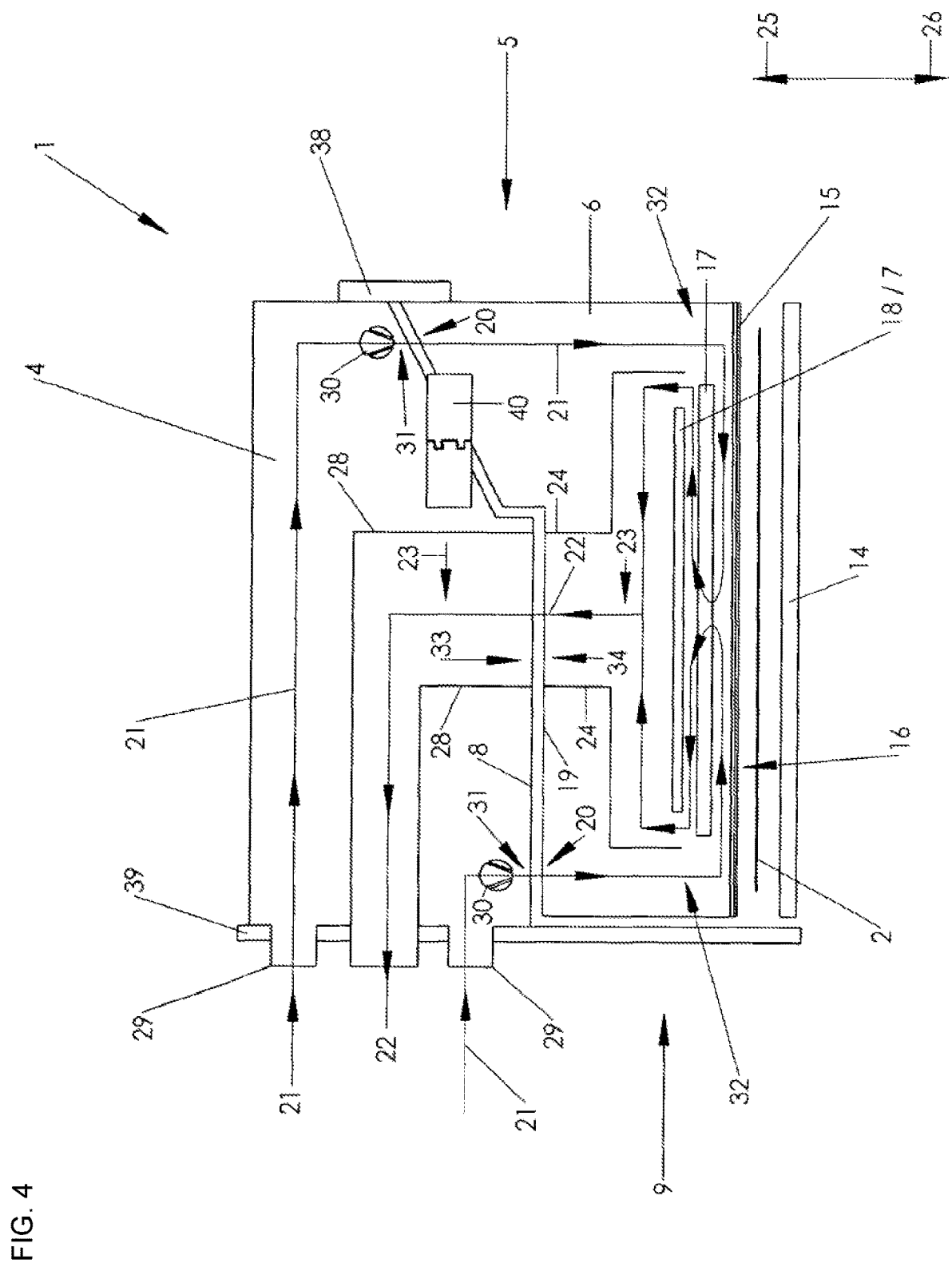
Figure 5:
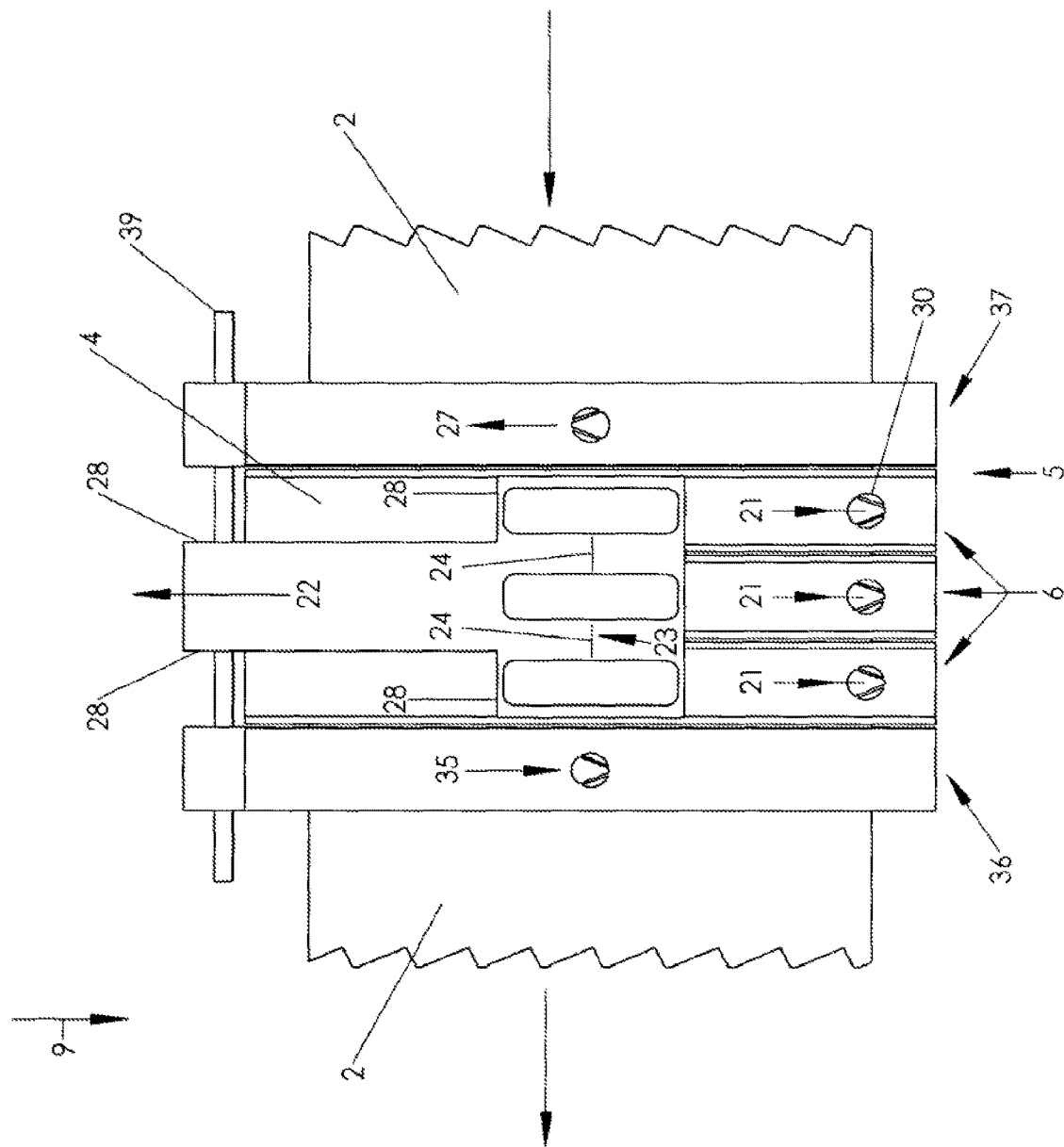

Particularly preferred embodiments of the apparatus according to the present invention are described in further detail with reference to the drawings. The following are shown:

FIG. 1 is a schematic front view (5) of an apparatus (1) according to the invention for irradiating a substrate (2), which comprises a top-side (25),—straight in relation to the longitudinal axis (3) of the platform (4)—platform (4), wherein three module attachment devices (10) are provided on the bottom side (8) of the platform (4) for a frontal insertion of three irradiation modules (6)—proceeding from the front side (5) of the apparatus (1) and extending in the direction of the back side (9) of the apparatus (1)—wherein a substrate supply air module (36) is provided on the one side of the three irradiation modules (6) and a substrate exhaust air module (37) is provided on the other side of the three irradiation modules (6) in order to generate an air flow to overcoat the substrate (2) to be irradiated, wherein, in each irradiation module (6), not yet heated, fresh, gaseous or liquid irradiation module cooling medium (21) can be supplied for cooling the lamp (17) of the irradiation module (6) and its reflector (18) with its cooling fins (7), wherein the irradiation module cooling medium (22) heated by the lamp (17)—only shown in FIGS. 3 and 4—can be discharged via a guide (24)—also only shown in FIGS. 3 and 4—out of the irradiation module (6)—indirectly via the central guide (28) of the platform (4) in the direction of the upper (25) platform (4)—outwardly;

FIG. 2 is a schematic front view (5) of an apparatus (1) according to the invention for irradiating a substrate (2), which comprises a top-side (25) platform (4) curved about the longitudinal axis (3) of the platform (4), wherein three module attachment devices (10) are provided on the bottom side of the curved platform (4) for a frontal insertion of three irradiation modules (6)—proceeding from the front side (5) of the apparatus (1) and extending in the direction of the back side (9) of the apparatus (1)—wherein a substrate supply air module (36) is provided on the one side of the three irradiation modules (6) and a substrate exhaust air module (37) is provided on the other side of the three irradiation modules (6) in order to generate an air flow (35) to overcoat the substrate (2) to be irradiated, wherein, in each irradiation module (6), not yet heated, fresh, gaseous or liquid irradiation module cooling medium (21) can be supplied for cooling the lamp (17) of the irradiation module (6) and its reflector (18) with its cooling fins (7), wherein the irradiation module cooling medium (22) heated by the lamp (17)—only shown in FIGS. 3 and 4—can be discharged via a guide (24)—also only shown in FIGS. 3 and 4—out of the irradiation module (6)—indirectly via the central guide (28) of the platform (4) in the direction of the upper (25) platform (4)—outwardly;

FIG. 3 is a schematic section along the line A-A shown in FIG. 1, which shows an upper (25) platform (4) and an irradiation module (6)—configured so as to correspond to the bottom side (8) of the platform (4)—wherein two conduits (29) for the not yet heated, fresh gaseous or liquid irradiation module cooling medium (21) open into the platform (4) from the outside, wherein—within the platform (4)—a ventilator (30) or a pump can be respectively integrated into these conduits (29), which accelerates or compresses the irradiation module cooling medium (21) in the direction of two irradiation module cooling medium outlet openings (31) of the platform (4), wherein the two irradiation module cooling medium outlet openings (31) are respectively provided on the bottom side (8) of the platform (4)—and on the one hand in the region of the back side (9) of the apparatus (1) and on the other hand in the region of the front side (5) of the apparatus (1)—wherein, on the top side (19) of the irradiation module (6,) two irradiation module cooling medium inlet openings (20) are provided for supplying irradiation module cooling medium (21) from the platform (4), wherein these irradiation module cooling medium inlet openings (20) of the irradiation module (6) are preferably functionally arranged and configured so as to operate in tandem with the irradiation module cooling medium outlet openings (31) of the platform (4), wherein the irradiation module cooling medium inlet openings (20) are directly connected to the end regions (32) of the lamp (17) located in the region of the front side (5) and the back side (9) of the apparatus (1) in a manner so as to guide cooling medium (21), wherein—for the purpose of a gas-tight closure of the radiation outlet opening (16) of the irradiation module (6)—a fully or partially transparent pane (15) is provided just below (26) the lamp (17) for the radiation emitted by the lamp (17), and a reflector (18) is provided just above (25) the lamp (17), wherein the not yet heated, fresh, gaseous or liquid irradiation module cooling medium (21) supplied from the platform (4) can be supplied to the end regions (32) of a gap between the bottom (26) glass pane (15) and the top (25) region of the reflector (18), which end regions are respectively open and oriented in the direction of the back side (9) of the apparatus (1) and in the direction of the front side (5) of the apparatus (1), wherein, in the center region (23) of the irradiation module (6)—when the irradiation module (6) is viewed from the side,—a guide (24) is provided above the lamp (17) upwardly (25) in the direction of the platform (4) for the heated irradiation module cooling medium (22) after fully or partially overcoating the lamp (17) along the bottom side and/or the top side of the lamp (17) in the direction of the center (23), wherein a locking device (38) acting between the front sides (5) of the platform (4) and the irradiation modules (6) is shown in the locking position, wherein this locking device (38) can only be brought into its closed locking position after the irradiation module (6) has been fully inserted into its respective module attachment device (10), and only then is the supply of electrical energy to the lamp (17) ensured, and wherein an electrically conductive coupling (40) between the bottom side (8) of the platform (4) and the top side (19) of the fully inserted irradiation module (6) is shown, which only allows the delivery of power to the irradiation module (6) when the irradiation module (6) is fully inserted into the associated module attachment device (10);

FIG. 4 is a schematic section along the line A-A shown in FIG. 1, which shows an upper (25) platform (4) and an irradiation module (6)—configured so as to correspond to the bottom side (8) of the platform (4)—wherein two conduits (29) for the not yet heated, fresh gaseous or liquid irradiation module cooling medium (21) open into the platform (4) from the outside, wherein—within the platform (4)—a ventilator (30) or a pump can be respectively integrated into these conduits (29), which accelerates or compresses the irradiation module cooling medium (21) in the direction of two irradiation module cooling medium outlet openings (31) of the platform (4), wherein the two irradiation module cooling medium outlet openings (31) are respectively provided on the bottom side (8) of the platform (4)—and on the one hand in the region of the back side (9) of the apparatus (1) and on the other hand in the region of the front side (5) of the apparatus (1)—wherein, on the top side (19) of the irradiation module (6) two irradiation module cooling medium inlet openings (20) are provided for supplying irradiation module cooling medium (21) from the platform (4), wherein these irradiation module cooling medium inlet openings (20) of the irradiation module (6) are preferably functionally arranged and configured so as to operate in tandem with the irradiation module cooling medium outlet openings (31) of the platform (4), wherein the irradiation module cooling medium inlet openings (20) are directly connected to the end regions (32) of the lamp (17) located in the region of the front side (5) and the back side (9) of the apparatus (1) in a manner so as to guide cooling medium (21), wherein—for the purpose of a gas-tight closure of the radiation outlet opening (16) of the irradiation module (6)—a fully or partially transparent pane (15) is provided just below (26) the lamp (17) for the radiation emitted by the lamp (17), and a reflector (18) is provided just above (25) the lamp (17), wherein the not yet heated, fresh, gaseous or liquid irradiation module cooling medium (21) supplied from the platform (4) can first be supplied to the edge regions of the glass pane (15), which edge regions are oriented in the direction of the back side (9) of the apparatus (1) and in the direction of the front side (5) of the apparatus (1), then overcoats the bottom side of the lamp (17) in the direction of the center (23) of the irradiation module (6), flows around the lamp (17) in a vertically upward manner in the center region (23), then—proceeding from the center region (23) outwards in the direction of the two end regions (32) of the lamp (17)—overcoats the top side of the lamp (17) and the bottom side of the reflector (18), then overcoats the two end regions (32) of the lamp (17) with the electrical contacts of the lamp (17), then is guidable in the direction of the center (23) of the irradiation module (6)—while contacting cooling fins (7) or, instead of the latter, heat exchangers provided on the back side of the reflector (18)—and then is guidable via a central guide (24) for the discharge of the heated irradiation module cooling medium (22) out of the irradiation module (6) in the direction of the central guide (28) of the platform (4)—for the discharge of the heated irradiation module cooling medium (22) to the outside, wherein a locking device (38) acting between the front sides (5) of the platform (4) and the irradiation modules (6) is shown in the locking position, wherein this locking device (38) can only be brought into its closed locking position after the irradiation module (6) has been fully inserted into its respective module attachment device (10), and only then is the supply of electrical energy to the lamp (17) ensured, and wherein an electrically conductive coupling (40) between the bottom side (8) of the platform (4) and the top side (19) of the fully inserted irradiation module (6) is shown, which only allows the delivery of power to the irradiation module (6) when the irradiation module (6) is fully inserted into the associated module attachment device (10);

FIG. 5 shows a schematic plan view, partially horizontally cut along line B-B in FIG. 1, of the apparatus (1) shown in FIGS. 1, 3, and 4, having three irradiation modules (6) arranged next to one another, wherein a substrate supply air module (36) is provided on the one side of the three irradiation modules (6) and a substrate exhaust air module (37) is provided on the other side of the three irradiation modules (6), wherein not yet heated, fresh, gaseous or liquid irradiation module cooling medium (21) can be introduced into each irradiation module (6)—after passing through a ventilator (30) or a pump—wherein, in the center regions (23) of each irradiation module (6), a guide (24) is provided, proceeding from the lower (26) lamp (17) or reflector (18) and extending upwards (25) for discharging the heated irradiation module cooling medium (22), wherein the upper (25) ends of the guide (24) for discharging the heated irradiation module cooling medium (22) of each irradiation module (6) open into a conduit (28) of the platform (4)—provided in the center region (23) of the platform (4)—for discharging heated irradiation module cooling medium (22), which discharges the heated irradiation module cooling medium (22) into a region lying outside the platform (4).

Figure 6:
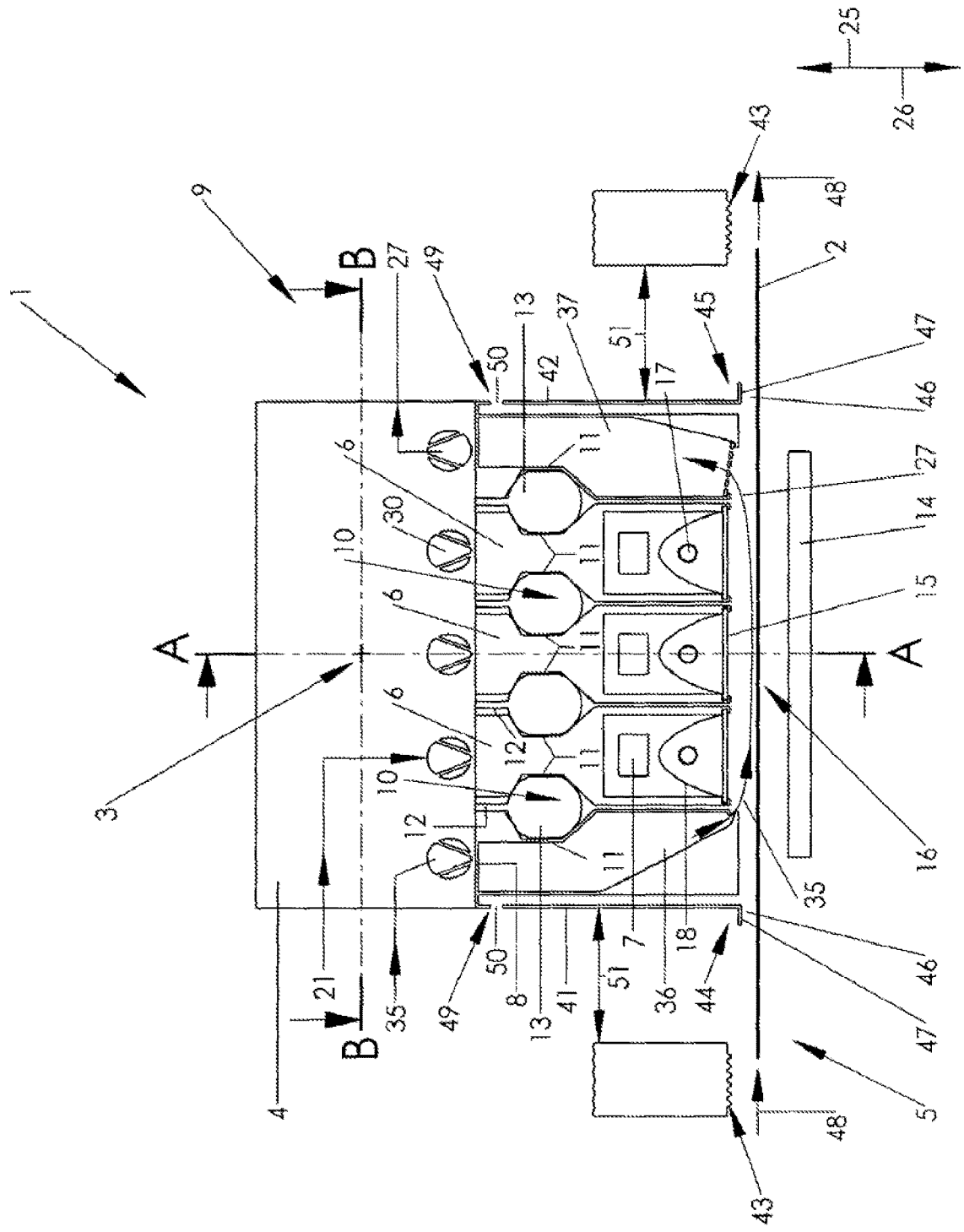

FIG. 6 shows a schematic front view (5) of an apparatus (1) according to the invention for irradiating a substrate (2) according FIG. 1, which—in relation to the conveying direction (48) of the substrate (2) to be irradiated—upstream of the upstream module (36), they comprise a printhead (43) for supplying substrate supply air (35) and, downstream of the downstream module (37), they comprise a printhead (43) for suction of substrate supply air (35), wherein, between the upstream printhead (43) and the upstream module (36) for supplying substrate supply air (35), a first bulkhead (41) or a first partition wall is provided and/or, between the downstream printhead(s) (43) and the downstream module (37) for suction of substrate supply air (35), a second bulkhead (42) or a second partition wall is provided, wherein, between the lower ends (44, 45) of the bulkheads (41, 42) or partition walls facing the substrate (2) to be irradiated on the one hand and the substrate (2) to be irradiated on the other hand, a gap (46) is formed, wherein, in the upper end regions (49) of the two bulkheads (41, 42) or partition walls facing away from the substrate (2) to be irradiated, a small-area or large-area recess (50) or opening is provided for the passage of air.

The subject matter of the present invention is thus an apparatus (1) for irradiating a substrate (2).

Typically, this apparatus (1) comprises a platform (4), which is straight or curved in relation to the longitudinal axis (3) of the platform (4).

In particularly preferred embodiments, one, two, three, four, five, six, seven, eight, nine, ten, or more irradiation modules (6) and/or substrate supply air modules (36) and/or substrate exhaust air modules (37) can be reversibly attachable indirectly or directly to the bottom side (8) of the platform (4).

The attachment of these modules (6, 36, 37) can occur, for example, by sliding or inserting or mounting these modules (6, 36, 37) into one or more fixed or telescoping module attachment devices (10) provided on the bottom side (8) of the platform (4) (see in particular FIGS. 1 and 2).

This sliding, insertion, or mounting of the modules (6, 36, 37) into the respective module attachment device (10) can preferably take place starting from the front side (5) of the apparatus (1) and extending in the direction of the back side (9) of the apparatus (1).

As already shown in FIGS. 1 and 2, the one or more module attachment devices (10) can each comprise a wall (12) aligned perpendicular to the bottom side (8) of the platform (4).

In general, these walls (12)—in their respective downwardly facing region—can bear a bilaterally extending, ridge-like projection (13) and/or a linear recess for bearing modules (6, 36, 37) that can be slid back and forth and slid therein.

Typically, each module (6, 36, 37) can then comprise one or more bar-like and/or linear recesses (11) or projections corresponding to the projection-like or recess-shaped bearing element of the wall (12).

In general, one or more conduits (29) can be provided for supplying not yet heated, fresh, gaseous, or liquid irradiation module cooling medium (21) inside and/or outside of the platform (4).

The gaseous or liquid irradiation module cooling medium (21) can be, for example, air, nitrogen, liquid nitrogen, one or more noble gases—or a mixture hereof—or a liquid, for example water, flowing water, or water mixed with condensates—for example acetaldehyde.

Inside and/or outside of the platform (4)—preferably integrated into these conduits (29)—one or more separate ventilators (30) can be provided for the not yet heated, fresh irradiation module cooling medium (21).

It can be seen, for example, from FIGS. 3 and 4 that one or more external conduits (29) for guiding the not yet heated, fresh irradiation module cooling medium (21) can open into each platform (4) from the outside.

As already stated, one or more ventilators (30) can be integrable into the one or more conduits (29) for guiding the not yet heated, fresh irradiation module cooling medium (21)—then inside or outside of the platform (4).

Typically, these ventilators (30) or pumps can accelerate or compress the not yet heated, fresh irradiation module cooling medium (21) in the direction of one or more outlet openings (31)—provided on the bottom side (8) of the platform (4) and at least in the region of the back side (9) of the apparatus (1) and/or in the region of the front side (5) of the apparatus (1)—for not yet heated and fresh irradiation module cooling medium (21).

In particular, it can be seen from FIGS. 3 and 4 that one or more irradiation module cooling medium inlet openings (20) for supplying the not yet heated, fresh irradiation module cooling medium (21) from the platform (4) can be provided on the top side (19) of each irradiation module (6).

As shown in particular in these FIGS. 3 and 4, these irradiation module cooling medium inlet openings (20) of each irradiation module (6) can be functionally arranged and configured so as to operate in tandem with the outlet openings (31) of the platform (4) for not yet heated and fresh irradiation module cooling medium (21).

Preferably, the irradiation module cooling medium inlet openings (20) can be connected to the end regions (32) of the lamp (17) located in the region of the front side (5) and/or the back side (9) of the apparatus (1) in a manner so as to guide not yet heated and fresh cooling medium (21), wherein, in these end regions (32), the electrical contacts between the lamp (17) and its irradiation module-side socket can be provided typically.

In preferred embodiments, just below (26) the lamp (17)—for the purpose of a gas-tight closure of the radiation outlet opening (16) of the irradiation module (6) as well as for the purpose of guiding the irradiation module cooling medium (21) in a closed circuit within the irradiation module (6)—, a fully or partially transparent pane (15) for the radiation emitted by the lamp (17) can be provided.

FIGS. 1 to 4 show that, just above the lamp (17), a reflector (18)—with or without cooling fins (7) or a heat exchanger—can be provided.

FIGS. 3 and 4 in particular show that the not yet heated, fresh irradiation module cooling medium (21) can be supplied typically to the respective open end region (32) of the gap between the lower (26) glass pane (15) and the reflector (18), said end region being located in the direction of the back side (9) of the apparatus (1) and/or in the direction of the front side (5) of the apparatus (1).

In particular according to FIGS. 3, 4 and 5, in the center region (23) of the irradiation module (6), said center region being located—when viewed from the side of the irradiation module (6)—above the reflector (18) and/or the cooling fins (7) and/or the heat exchanger, a guide (24) can be provided for the discharge of the irradiation module cooling medium (22) heated after the full or partial as well as one-time or repeated overcoating of the lamp (17), said discharge being directed vertically upward in the direction of the platform (4).

FIG. 4 shows that, in a particularly preferred embodiment of the apparatus (1) according to the invention, the not yet heated, fresh irradiation module cooling medium (21) can be initially suppliable in the direction of the back side (9) of the apparatus (1) and the two edge regions of the glass pane (15) located in the direction of the front side (5) of the apparatus (1).

Downstream, the fresh irradiation module cooling medium (21) can then overcoat the bottom side of the lamp (17) in the direction of the center (23) of the irradiation module (6).

Preferably, downstream of the center (23), the fresh irradiation module cooling medium (21) can flow around the lamp (17) in the center region (23) in a vertically upwardly directed manner.

Then—starting from the center region (23) and proceeding outwardly in the direction of the two end regions (32) of the lamp (17)—the fresh irradiation module cooling medium (21) overcoats the top side of the lamp (17) and the bottom side of the reflector (18).

In the downstream port, the irradiation module cooling medium (21) can then overcoat the two end regions (32) of the lamp (17) with the electrical contacts of the lamp (17).

Preferably, the irradiation module cooling medium (21) can then be guidable downstream in the direction of the center (23) of the irradiation module (6)—while contacting cooling fins (7) or, instead of the latter, heat exchangers provided on the back side of the reflector (18).

As is clearly discernible from FIG. 4, the heated irradiation module cooling medium (22) can then be guidable via a central guide (24) out of the irradiation module (6) in the direction of the central guide (28) of the platform (4)—for the discharge of the heated irradiation module cooling medium (22) to the outside.

In a further preferred embodiment, not shown graphically herein, one or more conduits (29) for guiding the not yet heated, fresh irradiation module cooling medium (21) can open into the platform (4) or can be integrated into the platform (4).

In these conduits (29)—outside and/or inside the platform (4)—one or more ventilators (30) and/or pumps can be respectively provided.

In general, these conduits (29) extend in the platform (4)—when viewed from the side—in the direction of the center (23) of the platform (4).

In this preferred embodiment of the apparatus (1) according to the invention—not shown graphically here—these conduits (29)—indirectly via a central guide (28) or directly—can open into an outlet opening located in the center region (23) of the platform (4) on the bottom side (8) of the platform (4).

There, typically, on the top side (19) and in the center region (23) of the irradiation module (6), one or more inlet openings—corresponding to the outlet opening on the bottom side (8) of the platform (4) and cooperating therewith—can be provided for not yet heated, fresh irradiation module cooling medium (21) exiting from the platform (4).

In this embodiment, downstream of the central inlet opening into the irradiation module (6)—a vertical, downwardly (26) facing guide (24) can be provided for guiding the not yet heated, fresh irradiation module cooling medium (21) from the outlet opening on the bottom side (8) of the platform (4).

Preferably, in this embodiment, in the lower end region of this guide, an apparatus can be provided for splitting the vertical, downwardly flowing irradiation module cooling medium flow into an irradiation module cooling medium partial flow directed in the direction of the back side (9) and into an irradiation module cooling medium partial flow directed in the direction of the front side (5) of the apparatus (1).

In the case of this embodiment, each of these irradiation module cooling medium partial flows—while flowing in the direction of the respective end region (32) open to the back side (9) or front side (5)—through the cooling fins (7) or heat exchanger indirectly or directly connected to the back side of the reflector (18).

Preferably, then, the irradiation module cooling medium (21) can flow through the respective front-side (5) or back-side (9) end region (32)—with the electrical contacts for the power supply of the lamp (17)—downstream. The irradiation module cooling medium (21) can then flow through the emitter region located above the lamp (17) between the bottom of the reflector (18) and the top of the lamp (17)—proceeding from the front-side (5) or back-side (9) end region (32)—in the direction of the center (23) of the irradiation module (6).

In this center region (23) in this embodiment, the irradiation module cooling medium (21) can then flow around the lamp (17) in a vertical, downwardly facing direction and in the direction of the glass pane (15) closing the radiation outlet opening (16).

Preferably, the irradiation module cooling medium (21) can then flow through the emitter region located below the lamp (17) between the glass pane (15) and the bottom of the lamp (17).

In general, in this embodiment, downstream thereof, one or more front-side (5) and/or back-side (9) guides can be provided for the vertical, upwardly directed guiding of the heated irradiation module cooling medium partial flow (22) in the direction of one or more outlet openings located on the top side (19) of the irradiation module (6).

In this embodiment, one or more inlet openings—respectively located in the region of the front side (5) and/or back side (9) of the apparatus (1)—can be provided on the bottom side (8) of the platform (4) for the heated irradiation module cooling medium (22)—flowing out of the outlet openings located on the upper side (19) of the irradiation module (6).

In such embodiments, which are particularly preferred, said inlet openings of the platform (4) for heated irradiation module cooling medium (22) can be connected to conduits for guiding heated irradiation module cooling medium (22) through the platform (4) into a region located outside the platform (4)

In the preferred embodiments of the apparatus (1) according to FIGS. 1 to 5 according to the invention, when the platform (4) is viewed from the side, a guide (28)—extending outwardly in relation to the platform (4)—can be provided in the center region (23) of the platform (4) for discharging the heated irradiation module cooling medium (22) originating from the vertical, upwardly directed central (23) guide (24) of the irradiation module (6) for discharging heated irradiation module cooling medium (22).

In the case of this preferred embodiment, the inlet opening (33) of the platform (4) for the heated irradiation module cooling medium (22) located on the bottom side (8) of the platform (4) can be functionally arranged and configured so as to operate in tandem with the opening (34) of the guide (24) located on the top side (19) of the irradiation module (6) for the discharge of the heated irradiation module cooling medium (22) from the irradiation module (6).

In particular, it can be seen in FIGS. 3 and 4 that the apparatus (1) according to the invention can comprise one or more locking devices (38) acting on the one hand between the front side (5) of each module (6, 36, 37) and on the other hand between the front side (5) of the platform (4).

These locking devices (38) are preferably designed such that an electrical supply of the modules (6, 36, 37) can occur indirectly or directly via the platform (4) only in this locking position of the locking device (38).

FIGS. 3 and 4 show that the apparatus (1) according to the invention can comprise one or more electrically conductive couplings (40), which can act in an electrically conductive manner between the bottom side (8) of the platform (4) on the one hand and the top side (19) of the irradiation module (6) on the other hand—only when the irradiation module (6) is fully inserted into its respective module attachment device (10).

Typically, the one or more lamps (17) for the emission of electromagnetic radiation of each irradiation module (6) are the same or different from one another.

Preferably, the lamp (17) can be respectively configured in the form of one or more electromagnetic radiation-emitting diodes (LEDs) and/or halogen emitters and/or halogen tubes.

In particularly preferred embodiments of the apparatus (1) according to the invention, the lamps (17) can be respectively configured in the form of one or more microwave emitters (12 mm to 1 mm) and/or IR emitters (760 nm to 0.5 mm; near infrared NIR: 760 nm to 2.5 µm; mean infrared MIR: 2.5 µm to 25 µm; far infrared FIR: 25 µm to 500 µm) and/or emitters for visible light (400 nm to 750 nm) and/or UV emitters (400 nm to 10 nm) and/or X-ray emitters (100 nm to $10^{-2}$ pm).

In particular, it can be seen in FIGS. 3 and 4 that, in the region of the back side (9) of the apparatus (1) for irradiating a substrate (2), a vertically aligned fastening plate (39) can be provided.

Preferably, on this vertically aligned fastening plate (39), the back sides of the platform (4) and/or the modules (6, 36, 37) can be attachable indirectly via module attachment devices (10) or directly.

To the extent that the apparatus (1) according to the invention for irradiating a substrate (2) comprises an upstream printhead (43) and/or a downstream printhead (43), exhaust air (35) leaking from the substrate supply air module (36) can indirectly or directly lead to a diminishing or dying down between the substrate (2) to be irradiated and the printheads (43). For example, the substrate supply air (35) flowing out of the substrate supply air module (36) can carry along ambient air, which can create a negative pressure within the inflow region of the substrate supply air (35) and can adversely affect the printhead(s) (43). This diminishing or dying down is in particular bothersome and feared because it adversely affects the printing result produced by the printheads (43) on the substrate (2) to be irradiated.

Thus, in a particularly preferred embodiment, the apparatus (1) according to the invention for irradiating a substrate (2) can comprise—as shown in FIG. 6 and in relation to the conveying direction (48) of the substrate (2) to be irradiated—upstream of the upstream module (36), one or more printheads (43) for supplying substrate supply air (35) and/or, downstream of the downstream module (37), one or more printheads (43) for extracting substrate supply air (35).

In the case of this particularly preferred embodiment, for example, between the upstream printhead(s) (43) and the upstream module (36) for supplying substrate supply air (35), a first bulkhead (41) or a first partition wall can be provided for the direct or indirect connection to the ambient air.

Alternatively or in addition to this first bulkhead (41), a second bulkhead (42) or a second partition wall for indirect or direct connection to the ambient air can be provided between the downstream printhead(s) (43) and the downstream module (37) for extracting substrate supply air (35).

FIG. 6 shows that between the lower ends (44, 45) of the bulkheads (41, 42) or partition walls facing the substrate (2) to be irradiated on the one hand and the substrate (2) to be irradiated on the other hand, a gap (46) can be formed. For example, the vertical height of this gap (46) can be in the range of 0.1 mm to 5.0 mm, preferably in the range of 0.2 mm to 3.0 mm, in particular in the range of 0.3 mm to 2.0 mm. Typically, the vertical height of the gap (46) can be sized as small as possible in order to eliminate the risk of diminishing in the region of the printhead(s) (43) by negative or positive pressure in the region between the substrate supply air module (36) and the substrate exhaust air module (37).

In FIG. 6, it can further be seen that in the upper end regions (49) of the two bulkheads (41, 42) or partition walls facing away from the substrate (2) to be irradiated, one or more small-area or large-area recesses (50) or openings are provided for the passage of air for compensating the negative and positive pressure.

These recesses (50) for passage of ambient air are indicated for the negative or positive pressure compensation, for example between the space between the substrate supply air module (36) and the substrate exhaust air module (37) on the one hand and the environment on the other hand.

FIG. 6 also shows that the lower ends (44, 45) of the bulkheads (41, 42) or partition walls can each bear an apparatus (47) for shutting off or controlling air overcoating the substrate (2) to be irradiated.

These apparatuses (47) for shutting off or controlling air for negative or positive pressure compensation can each have a horizontal length, for example in the range of 0.5 mm to 10.0 cm, preferably in the range of 1.0 mm to 8.0 cm, in particular in the range of 1.5 mm to 6.0 cm.

In particularly preferred embodiments of the apparatus (1) according to the invention, the vertical distance between the air passage recesses (50) or openings in the upper end regions (49) of the bulkheads (41, 42) or partition walls on the one hand and the apparatuses (47) for shutting off and/or controlling air overcoating the substrate (2) to be irradiated at the lower ends (44, 45) of the bulkheads (41, 42) or partition walls on the other hand, lies for example in the range of 1.0 cm to 1.5 m, preferably in the range of 1.5 cm to 1.0 m, in particular in the range of 2.0 cm to 80.0 cm.

In particularly preferred embodiments of the apparatus (1) according to the invention, the horizontal distance between the upstream bulkhead (41) or the upstream partition wall on the one hand and the upstream outer wall of the upstream substrate supply air module (36) on the other hand, as well as between the downstream bulkhead (42) or the downstream partition wall on the one hand and the downstream outer wall of the downstream substrate exhaust air module (37) on the other hand, respectively lies for example in the range of 0.5 mm to 20.0 cm, preferably in the range of 1.0 mm to 15.0 cm, in particular in the range of 1.5 mm to 12.0 cm.

For example, the horizontal distances (51) between the bulkheads (41, 42) or partition walls on the one hand and the printheads (43) on the other hand can lie in the range of 0.5 mm to 20.0 cm, preferably in the range of 1.0 mm to 15.0 cm, in particular in the range of 1.5 mm to 10.0 cm.

In summary, it is found that, in the context of the present invention, an apparatus (1) for irradiating substrates (2) is provided, which—in the event of a fault of one or more irradiation devices—allows for a particularly simple, fast, effortless repair that excludes the possibility of failure.

A further serious advantage of the apparatus (1) according to the invention for irradiation of substrates (2) is that the irradiation modules (6) can be adapted to a wide variety of radiation conditions or radiation qualities—in particular to different wavelengths and intensities—in a manner that is particularly simple, fast, effortless and excludes the possibility of failure. These advantages are in particular realized by the insertability—which is particularly simple, fast, effortless, and excludes the possibility of failure—of externally identical irradiation modules (6) having different lamps (17) into the module attachment devices (10).

These advantages are achieved in the apparatus (1) according to the invention in particular due to the fact that a defective irradiation module (6)—in a manner that is particularly simple, fast, effortless, and excludes the possibility of failure—is removable from the front of the module attachment device (10)—in the direction of the front side (5) of the apparatus (1).

After replacement of the defective irradiation module (6) with an intact irradiation module (6)—or after repair of the defective, removed irradiation module (6)—the intact irradiation module (6) can be reattached to the platform (4) and automatically correctly oriented in a manner that is particularly simple, fast, effortless, and excludes the possibility of failure by simply inserting it into the module attachment device (10) of the apparatus (1)—proceeding from the front side (5) of the apparatus (1) and advancing in the direction of the back side (9) of the apparatus (1).

The bulkheads (41, 42) or partition walls provided in particularly preferred embodiments of the apparatus (1) according to the invention lead to the serious advantage that any diminishing or dying down in the regions of printheads

(43) is safely avoided and, therefore, particularly contour-sharp and precise printing results can be achieved.

The invention claimed is:

1. An apparatus for irradiating a substrate, comprising:
a platform, which is straight or curved in relation to a longitudinal axis of the platform,
wherein one or more upstream modules and/or one or more downstream modules are reversibly attachable directly or indirectly to a bottom side of the platform by sliding or inserting or mounting in one or more fixed or telescoping module attachment devices provided on the bottom side of the platform, each extending from a front side of the apparatus and in a direction of a back side of the apparatus, wherein the one or more upstream modules include one or more of irradiation modules or substrate supply air modules, and wherein the one or more downstream modules include one or more substrate exhaust air modules,
wherein in relation to a conveying direction of the substrate to be irradiated, the apparatus further comprises: one or more upstream printheads upstream of the one or more upstream modules, the one or more upstream modules for supplying substrate supply air and/or,
downstream of the one or more downstream modules, the apparatus further comprises one or more downstream printheads, the one or more downstream modules for extracting substrate supply air,
wherein, between the one or more upstream printheads and the upstream module for supplying substrate supply air, a first bulkhead or a first partition wall is provided and/or,
between the one or more downstream printheads and the downstream module for extracting substrate supply air, a second bulkhead or a second partition wall is provided,
wherein, between lower ends of the bulkheads or partition walls facing the substrate to be irradiated and the substrate to be irradiated, a gap is formed, wherein a vertical height of this gap lies in a range of 0.1 mm to 5.0 mm, wherein, in upper end regions of the bulkheads or partition walls facing away from the substrate to be irradiated, one or more small-area or large-area recesses or openings are provided for passage of air.

2. The apparatus for irradiating a substrate according to claim 1, wherein the one or more module attachment devices each comprise a wall aligned perpendicular to the bottom side of the platform, which walls, in a downwardly facing region, each bear a bilaterally extending, ridge-like projection and/or a linear recess for bearing modules that are configured to be slid back and forth and slid therein, wherein each module comprises one or more bar-like recesses and/or the linear recesses or projections configured so as to correspond to the ridge-like projection or recess-shaped bearing element of the wall.

3. The apparatus for irradiating a substrate according to claim 1, wherein in relation to a supply of not yet heated, fresh, gaseous, or liquid irradiation module cooling medium via one or more conduits for guiding the not yet heated, fresh irradiation module cooling medium to the platform, one or more separate ventilators for the not yet heated, fresh irradiation module cooling medium are provided upstream of the platform, or
wherein, in each platform, one or more conduits for guiding the not yet heated, fresh irradiation module cooling medium open from outside the platform, wherein, one or more ventilators are configured to be integrated into the one or more conduits for guiding the not yet heated, fresh irradiation module cooling medium, then inside or outside the platform, which ventilators accelerate and/or compress the not yet heated, fresh irradiation module cooling medium in a direction of one or more outlet openings of the platform for not yet heated and fresh irradiation module cooling medium, wherein the one or more outlet openings of the platform for not yet heated, fresh irradiation module cooling medium are provided on the bottom side of the platform and at least in a region of the back side of the apparatus and/or in a region of the front side of the apparatus.

4. The apparatus for irradiating a substrate according to claim 1, wherein on a top side of each irradiation module, one or more irradiation module cooling medium inlet openings are provided for supplying not yet heated, fresh irradiation module cooling medium from the platform, wherein the irradiation module cooling medium inlet openings of each irradiation module are functionally arranged and configured so as to operate in tandem with outlet openings of the platform for not yet heated and fresh irradiation module cooling medium, wherein the irradiation module cooling medium inlet openings are connected to the end regions of a lamp located in the region of the front side and/or the back side of the apparatus in a manner so as to guide not yet heated and fresh cooling medium, wherein, below the lamp, for providing of a gas-tight closure of the outlet opening of the irradiation module as well as for providing of guiding the irradiation module cooling medium in a closed circuit within the irradiation module, a fully or partially transparent pane for radiation emitted by the lamp and, above the lamp, a reflector, with or without cooling fins or a heat exchanger, are provided, wherein not yet heated, fresh irradiation module cooling medium is supplied to the respective open end region of a gap between a lower glass pane and the reflector, said end region being located in the direction of the back side of the apparatus and/or in the direction of the front side of the apparatus, wherein, in a center region of the irradiation module, said center region being located, when viewed from the side of the irradiation module above the reflector and/or the cooling fins and/or the heat exchanger, a guide is provided for discharge of the irradiation module cooling medium heated after full or partial as well as one-time or repeated overcoating of the lamp, said discharge being directed vertically upward in the direction of the platform.

5. The apparatus for irradiating a substrate according to claim 4, wherein not yet heated, fresh irradiation module cooling medium is initially suppliable in the direction of the back side of the apparatus and two edge regions of the glass pane located in the direction of the front side of the apparatus, then overcoats the bottom of the lamp in the direction of the center of the irradiation module, flows around the lamp in the center region in a vertically upwardly directed manner, then, starting from the center region and proceeding outwardly in the direction of the two end regions of the lamp, overcoats the top side of the lamp and the bottom side of the reflector, then overcoats the two end regions of the lamp with electrical contacts of the lamp, then is guidable in the direction of the center of the irradiation module while contacting the cooling fins or, instead of contacting the cooling fins, heat exchangers are provided on the back side of the reflector, and then is guidable via a central guide for discharge of the heated irradiation module cooling medium from the irradiation module in the direction of the central guide of the platform for discharge of the heated irradiation module cooling medium to outside of the platform.

6. The apparatus for irradiating a substrate according to claim 5, wherein one or more conduits for guiding not yet heated, fresh irradiation module cooling medium open into the platform or are integrated into the platform, wherein, in the one or more conduits, outside and/or inside the platform, one or more ventilators and/or pumps are respectively provided, wherein these conduits extend in the platform when viewed from a side in the direction of a center region of the platform, wherein the conduits, indirectly via a central guide or directly, open into an outlet opening located in the center region of the platform on the bottom side of the platform, wherein, on a top side and in the center region of the irradiation module, one or more inlet openings, corresponding to the outlet opening on the bottom side of the platform and cooperating therewith, are provided for not yet heated, fresh irradiation module cooling medium exiting from the platform, wherein downstream of the central inlet opening into the irradiation module a vertical, downwardly facing guide is provided for guiding the not yet heated, fresh irradiation module cooling medium from the outlet opening on the bottom side of the platform, wherein, in the lower end region of this guide, an apparatus is provided for splitting the vertically downwardly flowing irradiation module cooling medium flow into an irradiation module cooling medium partial flow directed in the direction of the back side and into an irradiation module cooling medium partial flow directed in the direction of the front side of the apparatus, wherein each of these irradiation module cooling medium partial flows, while flowing in the direction of the respective end region open to the back side or front side through the cooling fins or heat exchanger indirectly or directly connected to the back side of the reflector, then flows through the respective front side or back side end region with the electrical contacts for a power supply of the lamp, then flows through an emitter region located above the lamp between the bottom of the reflector and the top of the lamp, proceeding from the front side or back side end region, in the direction of the center of the irradiation module, then flows around the lamp in a vertical, downwardly facing direction and in the direction of the glass pane closing the radiation outlet opening, then flows through the emitter region located below the lamp between the glass pane and the bottom of the lamp, wherein, downstream thereof, one or more front side and/or back side guides are provided for the vertical, upwardly directed guiding of the heated irradiation module cooling medium partial flow in the direction of one or more outlet openings located on the top side of the irradiation module, wherein one or more inlet openings are provided on the bottom side of the platform for the heated irradiation module cooling medium, flowing out of the outlet openings located on the upper side of the irradiation module, wherein said inlet openings of the platform for heated irradiation module cooling medium are connected to conduits for guiding heated irradiation module cooling medium through the platform into a region located outside the platform.

7. The apparatus for irradiating a substrate according to claim 6, wherein when the platform is viewed from a side, a guide extending outwardly in relation to the platform is provided in a center region of the platform for discharging the heated irradiation module cooling medium originating from the vertical, upwardly directed central guide of the irradiation module for discharging heated irradiation module cooling medium, wherein the inlet opening of the platform for the heated irradiation module cooling medium located on the bottom side of the platform is functionally arranged and configured so as to operate in tandem with the opening of the guide located on a top side of the irradiation module for discharge of the heated irradiation module cooling medium from the irradiation module.

8. The apparatus for irradiating a substrate according to claim 1, further comprising one or more locking devices acting between the front side of each module or between the front side of the platform, wherein an electrical supply of the modules occurs indirectly or directly via the platform only in this locking position of the locking device.

9. The apparatus for irradiating a substrate according to claim 1, further comprising one or more electrically conductive couplings, which act in an electrically conductive manner between the bottom side of the platform on or a top side of the irradiation module only when the irradiation module is fully inserted into its respective module attachment device.

10. The apparatus for irradiating a substrate according to claim 1, wherein one or more lamps for emission of electromagnetic radiation of each irradiation module are the same or different from one another, are respectively configured in the form of one or more electromagnetic radiation-emitting diodes (LEDs) and/or halogen emitters and/or halogen tubes, and are respectively configured in the form of one or more microwave emitters (12 mm to 1 mm) and/or IR emitters (760 nm to 0.5 mm; near infrared NIR: 760 nm to 2.5 µm; mean infrared MIR: 2.5 µm to 25 µm; far infrared FIR: 25 µm to 500 µm) and/or emitters for visible light (400 nm to 750 nm) and/or UV emitters (400 nm to 10 nm) and/or X-ray emitters (100 nm to $10^{-2}$ pm).

11. The apparatus for irradiating a substrate according to claim 1, wherein, in the region of the back side of the apparatus for irradiating a substrate, a vertically aligned fastening plate is provided, at which the back sides of the platform and/or the modules are attachable indirectly via module attachment devices or directly.

12. The apparatus for irradiating a substrate according to claim 1, wherein the lower ends of the bulkheads or partition walls each bear an apparatus for shutting off or controlling air overcoating the substrate to be irradiated, wherein these apparatuses each have a horizontal length in the range of 0.5 mm to 10.0 cm, wherein a vertical distance between the air passage recesses or openings in the upper end regions of the bulkheads or partition walls in one implementation and the apparatuses for shutting off and/or controlling air overcoating the substrate to be irradiated at the lower ends of the bulkheads or partition walls in another implementation lies in the range of 1.0 cm to 1.5 m, wherein the horizontal distance between the upstream bulkhead or the upstream partition wall in one implementation and an upstream outer wall of the upstream substrate supply air module in another implementation, as well as between the downstream bulkhead or the downstream partition wall in one implementation and the downstream outer wall of the downstream substrate exhaust air module in another implementation, respectively lies in the range of 0.5 mm to 20.0 cm, and wherein the horizontal distances between the bulkheads or partition walls in one implementation and the printheads in another implementation lies in the range of 0.5 mm to 20.0 cm.

* * * * *